United States Patent
Bugeja

(10) Patent No.: US 6,597,299 B1
(45) Date of Patent: Jul. 22, 2003

(54) COMPENSATION TECHNIQUES FOR ELECTRONIC CIRCUITS

(75) Inventor: Alexander Bugeja, Acton, MA (US)

(73) Assignee: Engim, Inc., Acton, MA (US)

( * ) Notice: Subject to any disclaimer, the term of this patent is extended or adjusted under 35 U.S.C. 154(b) by 0 days.

(21) Appl. No.: 10/135,186

(22) Filed: Apr. 29, 2002

Related U.S. Application Data

(60) Provisional application No. 60/287,394, filed on Apr. 30, 2001.

(51) Int. Cl.[7] .................................................. H03M 1/10
(52) U.S. Cl. ........................... 341/122; 341/120; 327/91
(58) Field of Search ................................ 341/118, 120, 341/122, 123; 327/91, 94

(56) References Cited

U.S. PATENT DOCUMENTS

| | | | |
|---|---|---|---|
| 5,410,269 A | * | 4/1995 | Ohie et al. ..................... 327/91 |
| 5,465,093 A | * | 11/1995 | Kusumoto et al. ........... 341/122 |
| 5,506,525 A | * | 4/1996 | Debroux ....................... 327/91 |
| 6,081,215 A | * | 6/2000 | Kost et al. .................... 341/120 |
| 6,204,794 B1 | | 3/2001 | Bult ............................ 341/155 |
| 6,229,354 B1 | * | 5/2001 | Rapakko ....................... 327/94 |
| 6,255,979 B1 | | 7/2001 | Allee et al. ................... 341/159 |
| 6,340,943 B1 | | 1/2002 | Chow et al. .................. 341/161 |
| 6,476,647 B2 | * | 11/2002 | Rapakko ....................... 327/91 |

OTHER PUBLICATIONS

Yoo, J., et al., "1–GSPS CMOS Flash Analog–to–Digital Converter for System–on–Chip Applications," In Proc. IEEE Computer Society Workshop on VLSI, pp. 123–456 (Apr., 2001).

Yoo, J., et al., "Future–Ready Ultrafast 8bit CMOS ADC for System–on–Chip Applications," In Proc. IEEE Int'l ASIC/SOC Conf., pp. 789–793 (Sep. 2001).

* cited by examiner

*Primary Examiner*—Howard L. Williams
(74) *Attorney, Agent, or Firm*—Hamilton, Brook, Smith & Reynolds, P.C.

(57) ABSTRACT

A sample and hold circuit including a capacitor is charged to a sample voltage from an open loop circuit such as a transistor circuit controlled by an input voltage. The sample voltage on the capacitor is converted to a digital signal via an ADC (Analog to Digital Converter). A digital correction circuit compensates for differences in voltage between the sample voltage on the capacitor and the input voltage based on properties of the open loop circuit and successive sample voltages on the capacitor. Consequently, nonlinearities can be compensated so that use of an open loop circuit or transistor circuit is less likely to negatively impact an overall accuracy of the ADC device.

29 Claims, 6 Drawing Sheets

COMPENSATION TECHNIQUES FOR ELECTRONIC CIRCUITS

RELATED APPLICATION(S)

This application claims the benefit of U.S. Provisional Application No. 60/287,394 filed on Apr. 30, 2001, the entire teachings of which are incorporated herein by reference.

BACKGROUND OF THE INVENTION

Closed loop sample and hold circuits are often used in ADC (Analog-to-Digital Converter) circuits because of their high precision. In some cases, their precision is only limited by second-order effects related to switch non-linearities and buffer skewing. One notable drawback of using closed loop circuits in ADCs is their slow speed that results from the effects of feedback.

In contrast to closed loop circuits, open loop sample and hold circuits can be used in the fastest ADC circuits because of their ability to handle high speed signals (provide high input bandwidth) and reasonable power consumption. Open loop circuits typically employ at least one circuit in a feed-forward loop, in which non-linearities are not corrected by feedback. Thus, even though open loop circuits are fast, their use often results in additional circuit non-linearities that negatively impact the accuracy of a corresponding ADC device.

SUMMARY OF THE INVENTION

One aspect of the present invention is directed towards compensating open loop circuits in ADC devices. In an illustrative embodiment, a sample and hold circuit including a capacitor is charged to a sample voltage from an open loop circuit such as a transistor circuit controlled by an input voltage. The sample voltage on the capacitor is converted to a digital signal via an ADC (Analog to Digital Converter). A digital correction circuit compensates for differences in voltage between the sample voltage on the capacitor and the input voltage based on properties of the circuit and successive sample voltages on the capacitor. Consequently, non-linearities can be corrected so that use of an open loop circuit or transistor circuit is less likely to negatively impact an overall accuracy of the ADC device.

In one application, the system for converting an analog input voltage includes multiple sample and hold circuits. For example, a first open loop sample and hold circuit can include a capacitor charged to a first sample voltage from a first transistor controlled by the input voltage. Additionally, a second open loop sample and hold circuit can include a capacitor charged to a second sample voltage from a second transistor also controlled by the input voltage. A digital correction circuit can compensate for non-linearities of at least one of the open loop circuits based on properties of the transistors and sample voltages on the capacitors at different times. More specifically, sample voltages on corresponding sample and hold circuits that track the input voltage can be converted at skewed sample times to compensate for non-linearities or device properties.

Each sample and hold circuit can include a current source to bias a transistor to produce a sample voltage on a corresponding capacitor. For example, an input voltage to be converted to a digital value can be applied to the base of a biased transistor. The output of the transistor, such as the emitter, can be coupled to charge the capacitor to a sample voltage. As discussed, the sample voltage on the capacitor can be fed to an ADC device for conversion.

A control circuit can be used to selectively couple the input voltage to the transistor and selectively activate a current source to bias the transistor. For example, the control circuit can control a switch that connects the input voltage to the transistor. Another switch can connect a current source to bias the transistor. Consequently, during a tracking mode, the input voltage can be coupled to the transistor to produce a sample voltage on the capacitor. During a hold mode, the capacitor stores the sample voltage and can be isolated from biasing and a potentially changing input voltage.

A digital correction circuit can correct for at least one non-linearity in an open loop circuit or transistor by accounting for an approximate current drawn by the capacitor as a result of a changing input voltage. One technique of correcting the non-linearities imparted by an open loop circuit is to approximate how much current is drawn by the capacitor during a charging period. Based on this information and other characteristics of the corresponding sample and hold circuit, the input voltage can be estimated.

In a specific application, the current drawn by the capacitor during a charge period can cause a voltage drop across the transistor depending on a changing input voltage. By calculating or approximating the current through the capacitor at the time of sampling, a corresponding portion of voltage drop between the input voltage and sample voltage caused by the current through the capacitor can be estimated. Accordingly, a precise value of the input voltage can be more accurately determined by compensating for the non-linearities of the open loop circuit.

The value of the input voltage at a particular time can be estimated using analog-to-digital conversions of sample voltages on the capacitor at two or more skewed sample times. For example, it is known that the sample voltage approximately tracks the input voltage as a consequence of the open loop circuit driving the capacitor. That is, the input voltage can drive an open loop gain circuit such as an emitter follower circuit to store a sample voltage on the capacitor. Values of multiple sample voltages on the capacitor can be used to identify how the input voltage changes over time. Based on how the sample voltage on the capacitor changes over time, the amount of current drawn by the capacitor and, hence, voltage drop across the transistor caused by a changing input voltage can be determined.

As previously discussed, multiple sample and hold circuits driven by a common input voltage can be implemented to accurately estimate the input voltage. A first sample voltage can be produced by a first open loop circuit and a second sample voltage can be produced by a second open loop circuit. A delay element to offset sample clocks of the first and second open loop circuits can be used to obtain corresponding time delayed sample voltages that are used to estimate an actual value of the input voltage.

The techniques according to the principles of the present invention are advantageous over the prior art. For example, an inherently fast open loop circuit such as a transistor in an emitter follower configuration can be used in a sample and hold circuit of an ADC device without foregoing overall converter accuracy.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
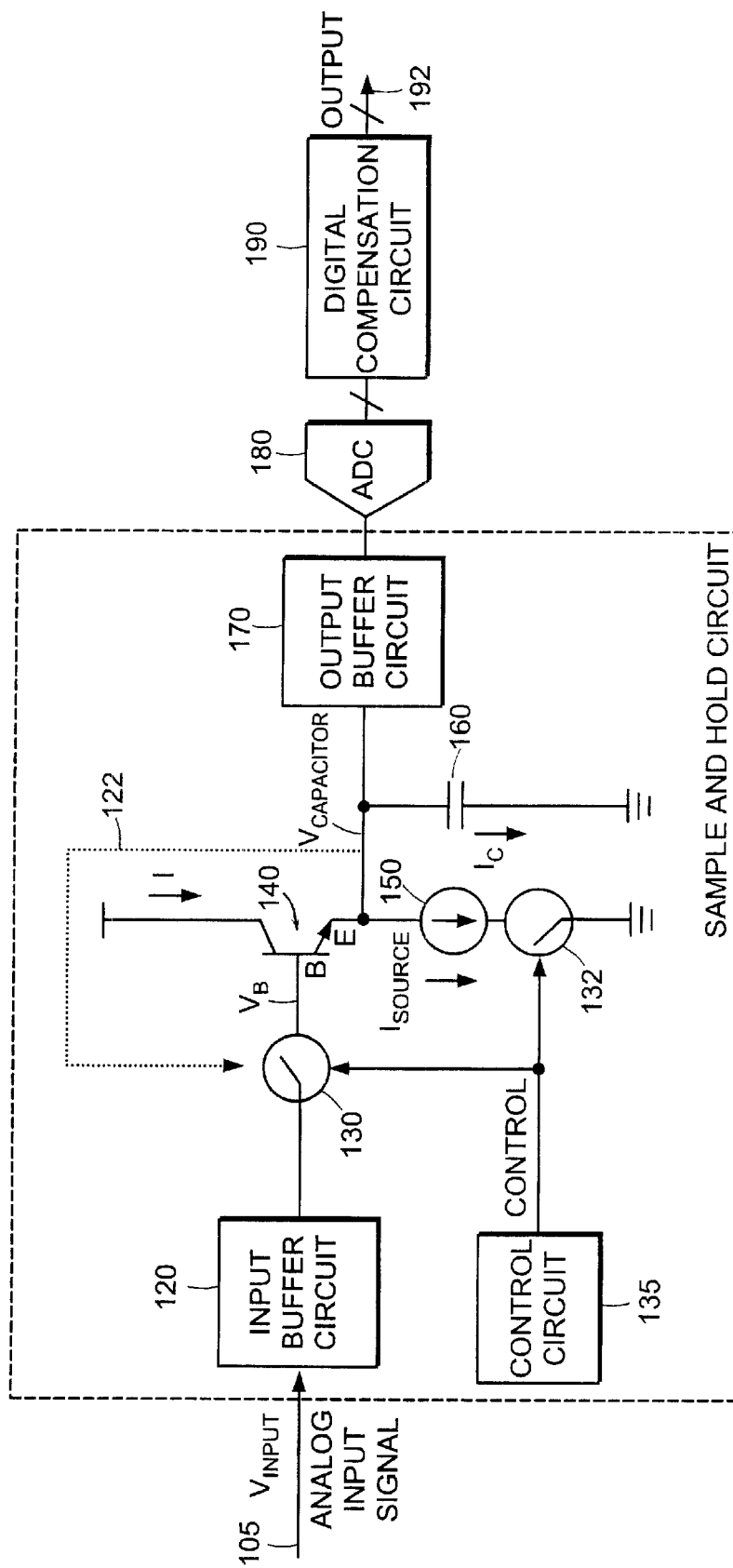
FIG. 1 is a diagram of an open loop ADC circuit according to certain principles of the present invention.

FIG. 1 is a circuit diagram of an ADC device according to certain principles of the present invention. In general, compensation techniques can be used to account for non-linearities in sample and hold circuit 110. Although sample and hold circuit 110 is shown as an emitter follower circuit including transistor 140 and capacitor 160, any suitable substitute circuit can be used in its place according to the principles of the present invention.

As shown, analog input signal 105, $V_{input}$, is fed into input buffer circuit 120. An output of buffer circuit 120 is fed to switch 130. Typically, the output of circuit 120 is a tracking voltage of $V_{input}$. For example, when input buffer circuit 120 is set to unity gain, the output of buffer circuit 120 is equal to input voltage 105.

During operation, switch 130 as well as switch 132 are selectively activated based on control signals from control circuit 135. When sample and hold circuit 110 is in a tracking mode, both switches are set to a closed position so that input voltage 105 is applied to base of transistor 140 and current source 150 drives current through switch 132 to bias transistor 140.

It should be noted that although transistor 140 is shown as a bipolar junction NPN transistor, any suitable transistor types such as analogous MOSFET (Metal Oxide Semiconductor Field Effect Transistor) devices and circuits can be substituted in place of transistor 140. Of course, such a component or circuit substitution may require analogous modifications to sample and hold circuit 110.

Current source 150 can be a constant current source so that transistor 140 operates in the forward-active mode when switch 132 is closed. Consequently, voltage $V_B$ which is equal to $V_{input}$ drives transistor 140 to produce a voltage on capacitor 160. During the tracking mode, current source 150 biases transistor 140 to produces a sample voltage on capacitor 160. Generally, the sample voltage on capacitor 160 is equal to the input voltage 105 less the voltage across the base/emitter of transistor 140.

Control circuit 135 can turn off switches 130 and 132 to disconnect current source 150 and input voltage 105 from transistor 140. In this "hold" mode, the voltage on capacitor 160 is a steady value and can be converted by ADC 180.

Output buffer circuit 170 couples the voltage on capacitor 160 to ADC 180 for conversions. The output of ADC 180 is fed to digital compensation circuit 190. In general, according to certain principles of the present invention, techniques are used to compensate for properties of open loop sample and hold circuit 110. For example, current drawn by capacitor 160 while in a tracking mode can result in a corresponding voltage drop across $V_{BE}$, causing inaccurate ADC readings.

Additional current in excess of $I_{SOURCE}$ from current source 150 flows through the emitter of transistor 140 when $V_{input}$ changes over time. This current from emitter of transistor 140 is used to charge capacitor 160. The current, $I_c$, through capacitor 160 causes the difference voltage $V_{BE}$ to vary depending on variations of the input voltage. Specific compensation or correction techniques will be discussed in more detail later in this specification.

Transistor 140 can exhibit dynamic nonlinearities in driving capacitor 160, owing to the current dependence of the device base-emitter voltage $V_{BE}$. As discussed, current source 150 can provide a fixed bias current $I_{SOURCE}$, but capacitor 160 draws a portion of this current proportional to the rate of voltage change across capacitor 160 away from the emitter of transistor 140. The resulting modulation of the base-emitter of transistor 140 can be mathematically characterized by the exponential (hence nonlinear) relationship:

$$I_{emitter} = I_s e^{\frac{V_{BE}}{V_T}} \qquad (\text{eq. 1})$$

where $I_{emitter}$=current through emitter of transistor 140, $I_S$=transistor saturation current $V_{BE}$=Voltage across base-emitter $V_T$≅thermal voltage constant of approximately 26 mV @ room temperature Current through capacitor 160 causes nonlinearities in the final voltage across the capacitor after the sampling switch opens. These nonlinearities are not corrected by any closed loop feedback loops. Feedback loop 122 is sometimes implemented to ensure correct turn-off operation, and does not alter this situation.

Closed loop techniques can usually be applied to the input buffer circuit 120 because it does not need to drive a large load. In contrast, the output buffer drives the ADC input, which can be large relative to the sampling capacitance. It does so only with a constant sampled input and does not need to track a high bandwidth signal. Output buffer circuit 170 therefore can be a closed loop device also.

Figure 2:
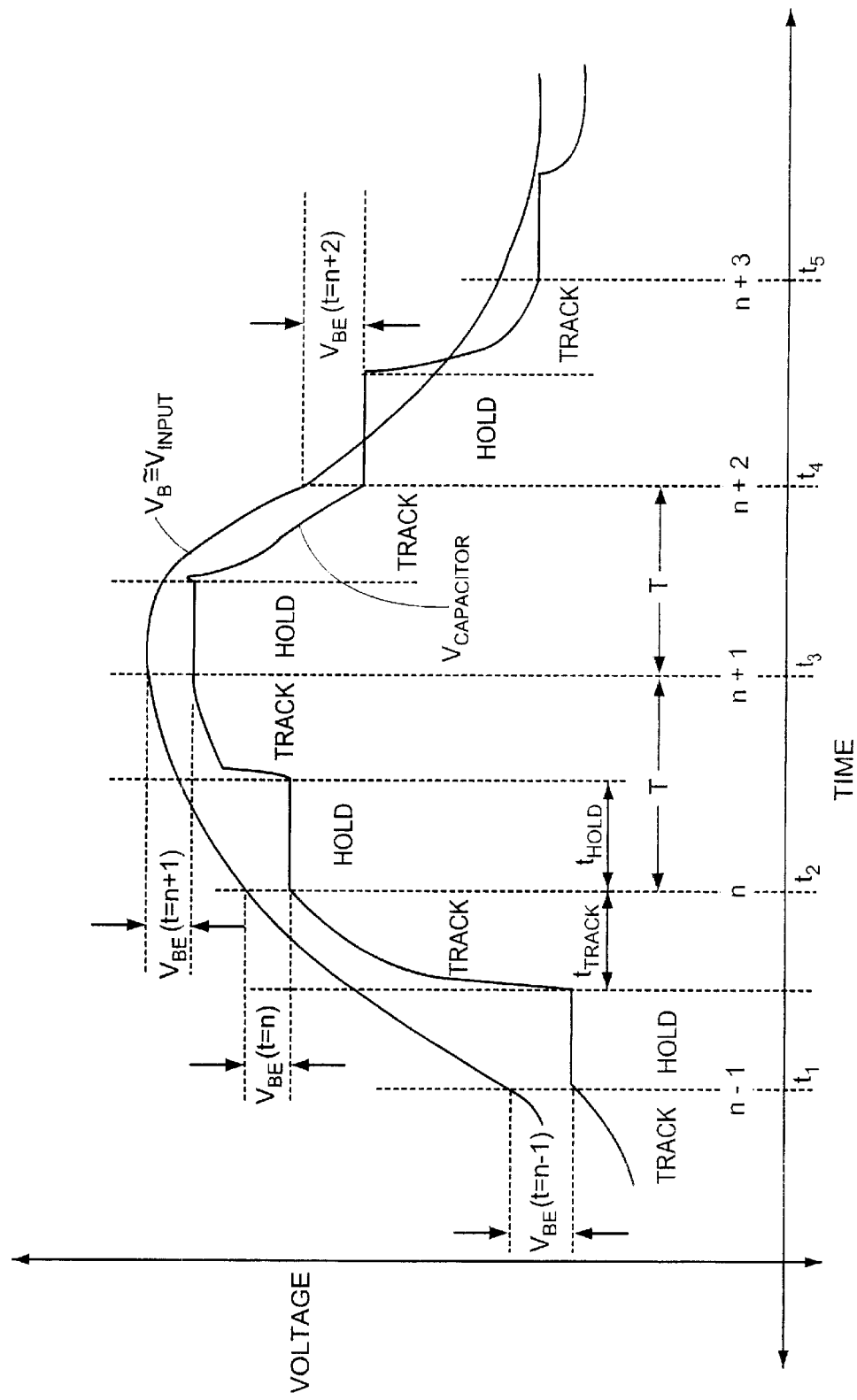
FIG. 2 is a graph illustrating a sample voltage on a capacitor and how it tracks an input voltage according to certain principles of the present invention.

FIG. 2 is a graph of an input voltage versus time according to certain principles of the present invention. As shown, $V_B$ (voltage of base on transistor 140) is effectively input voltage 105 when switch 130 is closed. $V_{capacitor}$ represents input voltage 105 less the voltage drop, $V_{BE}$, across base/emitter of transistor 140. A portion of time period, T, is used to hold (designated $t_{hold}$) a sample voltage on capacitor 160 to convert the value to a digital output, while a balance of a time period is used to track (designated $t_{track}$) the input voltage 105 as previously discussed.

The voltage on capacitor 160 can be used to determine the value of input voltage 105. More specifically, an actual value of input voltage 105 can be estimated by identifying the voltage on capacitor 160 and adding voltage drop $V_{BE}$ caused by bias current, $I_S$.

In general, the value of $V_{BE}$ is effected by at least two currents. For example, when switches 130 and 132 are "on", current source 150 draws a constant bias current $I_{source}$ through the emitter of transistor 140. Current $i_c$ through capacitor 160 varies as a result of a changing input voltage 105 and also affects $V_{BE}$. Thus, the current flowing through capacitor 160 affects the dynamics of the sample and hold circuit. As discussed, the variability of current through capacitor 160 can be estimated to compensate for a drop across $V_{BE}$ according to the principles of the present invention.

Figure 3:
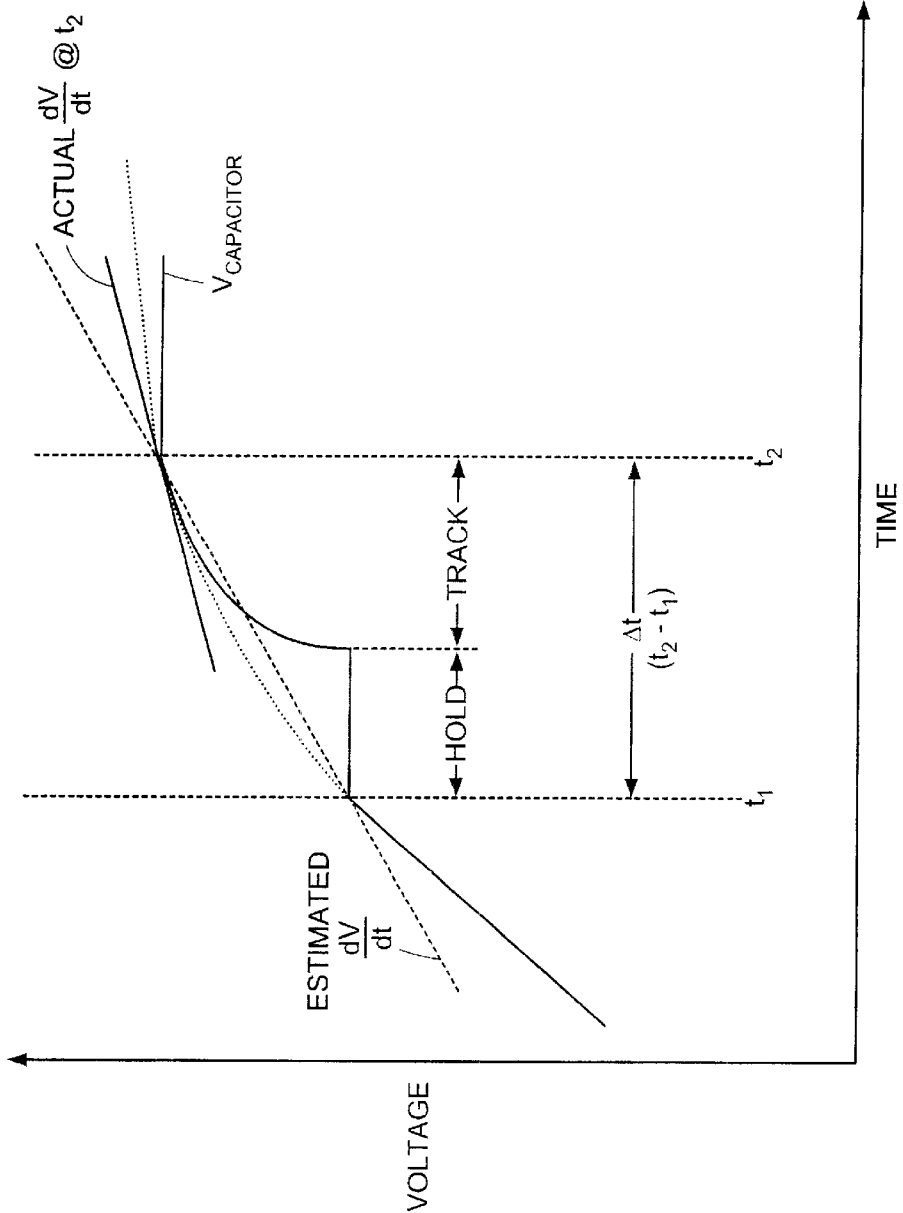
FIG. 3 is a graph illustrating correction of non-linearities of a circuit according to certain principles of the present invention.

FIG. 3 is a graph that more particularly illustrates a technique for estimating a current through a capacitor based on successive sample voltages. It is known that $I_c=$ $$I_c = C \frac{dv}{dt},$$

which can be estimated using dV/dt illustrated by equation 2 at time $t_2$.

The actual current through capacitor 160 at time $t_2$ can be estimated by drawing an imaginary line through time points $t_1$, and $t_2$ of signal $V_{capacitor}$. Specifically, the current through capacitor at time $t_2$ can be estimated based on the following equation:

$$I_c(t_2) = C \frac{dV}{dt} \cong C \frac{\Delta V}{\Delta t} = C \frac{[V_{capacitor}(t_2) - V_{capacitor}(t_1)]}{t_2 - t_1} \quad \text{(eq. 2)}$$

This estimated value of $I_c$ can be substituted into the above equations to more precisely calculate the effective input voltage 105 at a given point in time. Note that $I_c(t)=0$ only if $V_B$ and thus $V_{capacitor}$ is constant.

$V_B(t)$ is the voltage we wish to accurately measure. If we assume $V_{BE}$ is constant, $V_{BE}$ itself becomes an offset and is unimportant in terms of linearity effects. One aspect of the present invention is to measure deviations from this offset, not necessarily the absolute value of $V_{BE}$ itself.

Let the nth sample of the emitter voltage measured be $V_E(n)$ and the previous and subsequent samples be $V_E(n-1)$ and $V_E(n+1)$ respectively, as shown in FIG. 2 for a representative waveform. We can also write:

$$I_{emitter} = I_{SOURCE} + I_c = I_s e^{\frac{V_{BE}}{V_T}} \quad \text{(eq. 3)}$$

Therefore, $$V_{BE} = V_T \ln\left(\frac{I_{SOURCE} + I_c}{I_s}\right) = V_B - V_E \quad \text{(eq. 4)}$$

and $$V_B = V_E + V_T \ln\left(\frac{I_{SOURCE} + I_c}{I_s}\right), \quad \text{(eq. 5)}$$

where $V_B$=desired voltage of base to be determined
$V_L$=measured voltage of emitter or capacitor
$I_{SOURCE}$=bias current of source 150
$I_c$=current through capacitor 160
$I_S$=saturation current of transistor Since $I_{SOURCE}$ and $I_S$ are known or can be calculated, we can calculate $V_B(n)$ accurately (and hence the deviation from the ideal $$V_T \ln\left(\frac{I}{I_s}\right)$$

value) if we accurately knew $$I_c(n) = C \frac{dV_E}{dt} \text{ for a given time } t_n. \quad \text{(eq. 6)}$$

The computation can be done digitally as a post-processing operation. The implementation of the function in digital logic is well known. It can be done in many ways including look-up tables and power series approximations. The method depends on estimating $I_c(n)$. Two useful alternative equations for estimating $I_c$ in the above equation are as follows:

$$I_c(n) \cong C \frac{V_E(n) - V_E(n-1)}{T} \quad \text{(eq. 7)}$$

$$I_c(n) \cong C \frac{V_E(n+1) - V_E(n-1)}{2T} \quad \text{(eq. 8)}$$

It should be noted that higher order mathematical equations also can be used to approximate a the current going through the capacitor.

In general, the closer together are the timepoints referred to in the equation, and the closer they are to the nth timepoint, the more accurate the estimate of the derivative so long as the sampling period is considerably less than the input signal period. Using timepoint measurements to estimate the derivative of $I_c$ may therefore be inappropriate in undersampled situations if high frequency measurements of the input are required. If the high frequency data is unimportant however, the ADC can still be made to reject it correctly. We make this observation on two grounds: first the value of $V_E$ is low pass filtered by the sampling capacitor, and can be set to reject high frequency, and secondly the calculation of the current based on the values of $V_E$ will then not include the rapidly changing components of the current.

Figure 4:
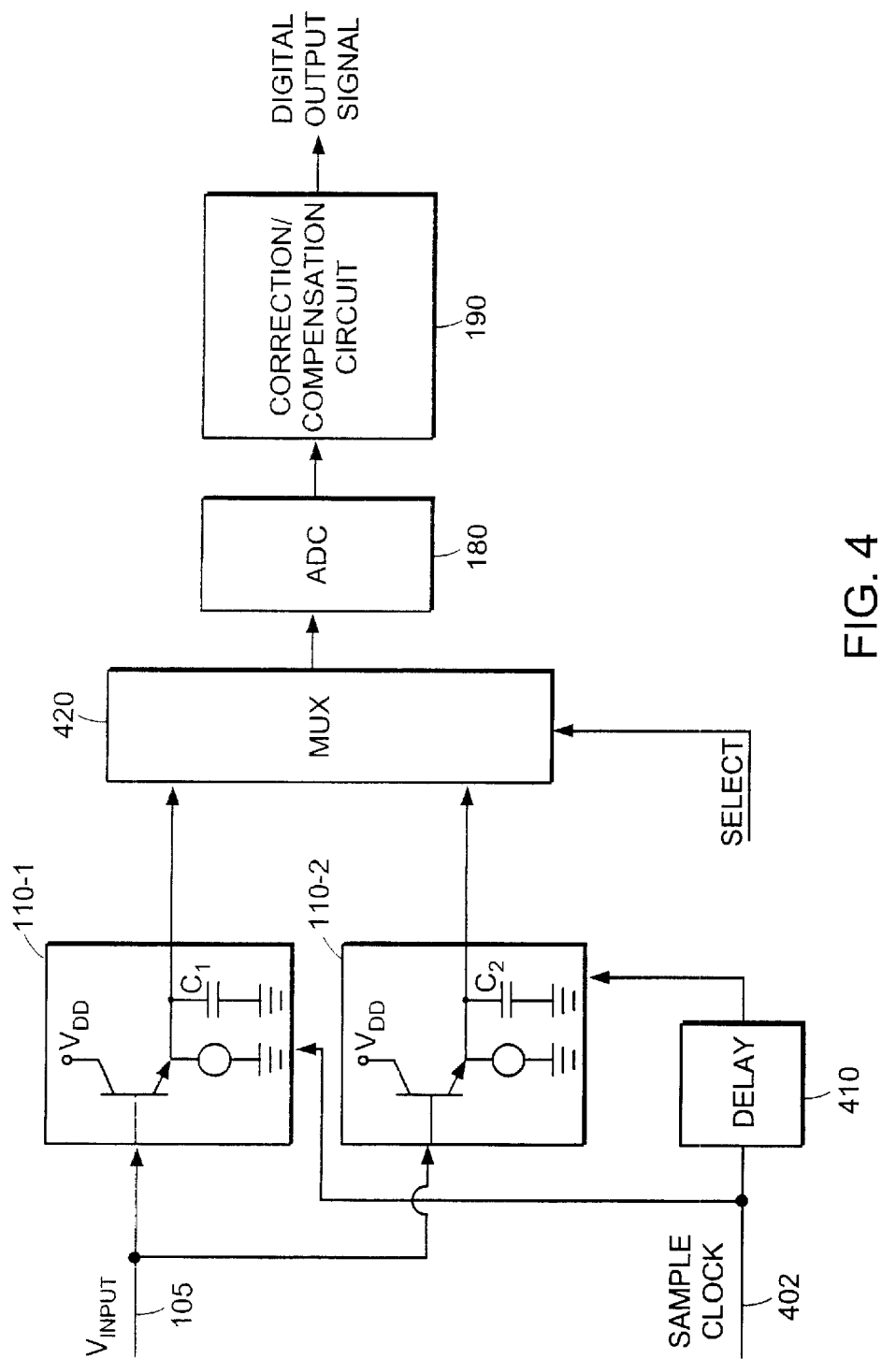
FIG. 4 is a block diagram of an analog-to-digital converter device according to certain principles of the present invention.

FIG. 4 is a block diagram of an alternative ADC circuit embodiment. As shown, input voltage 105 is fed into respective sample and hold circuits 110-1 and 110-2. Any suitable number of sample and hold circuits 110 can be used even though only two are shown. Typically, a single ADC will run at double the speed than a case when two separate ADCs are used as in FIG. 5.

Referring again to FIG. 4, sample clock 402 is fed into sample and hold circuit 110-1 to control track and hold periods. Delay element 410 skews sample clock 402 by a skew time of $t_{skew}$. Based on the delayed or skewed clock, sample and hold circuit 110-2 tracks and holds sampling of input voltage 105 a delayed amount of time. In one application, the skew time is smaller than a single system clock cycle.

Both outputs of sample and hold circuits 110-1 and 110-2 are fed to multiplexer 420, which selectively connects sample voltages of corresponding capacitors to ADC 180 at skewed times. In general, use of multiple sample and hold circuits 110 allows input voltage 105 to be more closely tracked and sampled by a common ADC 180. Consequently, errors imparted by ADC 180 cancel because a common ADC device is used to perform conversions.

Two slower or half-speed ADCs can be used but mismatch of circuits may result. This mismatch can be can be corrected using calibration techniques.

Figure 5:
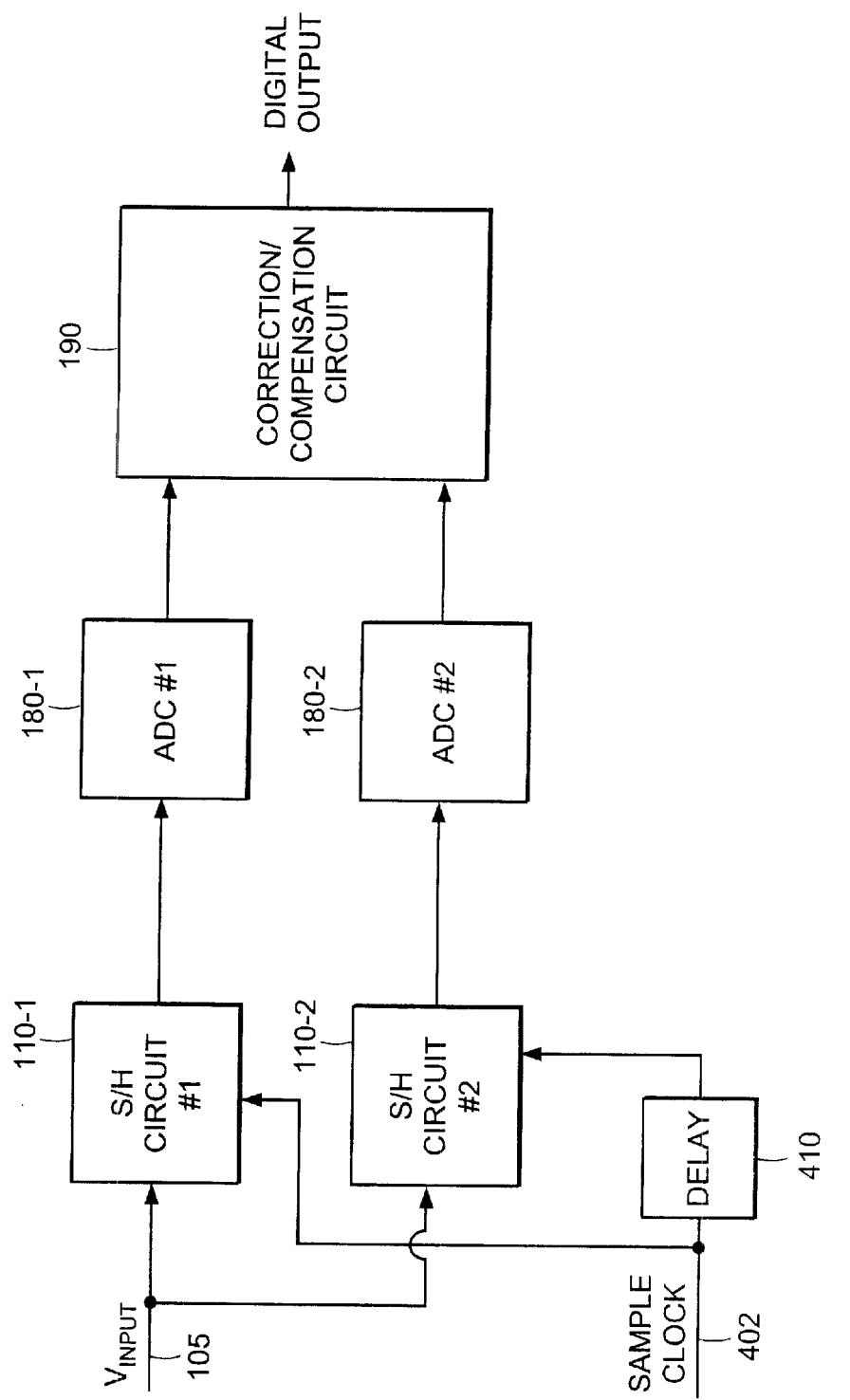
FIG. 5 is a block diagram of an analog-to-digital converter device according to certain principles of the present invention.

FIG. 5 is a block diagram of an ADC circuit including multiple ADC devices 180-1 and 180-2 instead of the multiplexer and single ADC 180 of FIG. 4. Mismatch resulting from multiple ADC devices can be reduced using calibration techniques.

Figure 6:
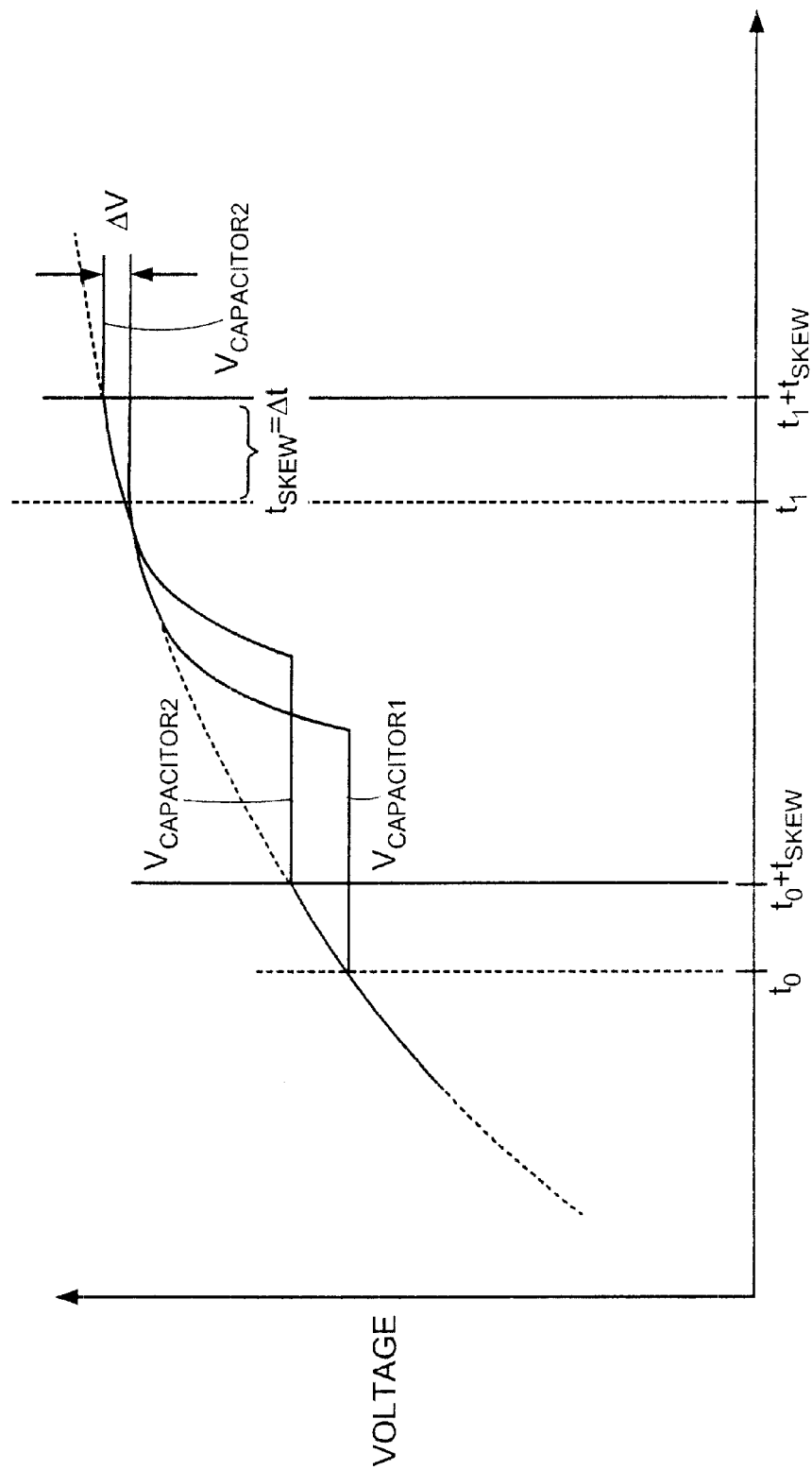
FIG. 6 is a graph illustrating a technique of sampling an input voltage using multiple sample and hold circuits according to certain principles of the present invention.

FIG. 6 illustrates a voltage versus time graph for sample and hold circuits according to certain principles of the present invention.

As shown, input voltage 105 is sampled at two skewed samples times namely, $t_1$ and $t_1 + t_{skew}$. Each sample and hold circuit tracks the same input voltage but samples at different times. A more accurate estimate of current through capacitor 160 can be determined using the equation:

$$I_{c2}(t_1 + t_{skew}) \cong \frac{C_2[V_{capacitor2}(t_1 + t_{skew}) - V_{capacitor1}(t_1)]}{t_{skew}}$$

Generally, the estimated slope of $V_{capacitor}$ more nearly reflects the actual slope of $V_{capacitor}$ as $t_{skew}$ goes to zero. Thus, multiple sample/hold circuits can be used to more accurately determine an actual value of the input voltage at a particular point in time.

As shown in FIG. 4, a single ADC at 2X speed can be used to perform conversions.

Based on the above equations, an approximated value of $I_c$ can be substituted into equation 5 to determine a more accurate value of the input voltage. As mentioned, the other terms in the equation are known and can be measured.

In one application, the value of the input voltage is determined based on a difference voltage applied to a look-up table. For example, the voltage of the capacitor at two different sample times can be input to a lookup table, an output of which is the a digital sequence identifying a value of the input voltage.

In one embodiment, equation 1 is simply used to calculate $V_B$ given the current, using conventional DSP (Digital Signal Processing) circuitry.

While this invention has been particularly shown and described with references to preferred embodiments thereof, it will be understood by those skilled in the art that various changes in form and details may be made therein without departing from the scope of the invention encompassed by the appended claims.

What is claimed is:

1. An analog-to-digital circuit comprising:
   a sample and hold circuit including a capacitor charged to a sample voltage from a transistor controlled by an input voltage;
   an analog-to-digital converter which converts the sample voltage on the capacitor to a digital signal; and
   a digital correction circuit which compensates for differences in voltage between the sample voltage on the capacitor and the input voltage based on properties of the transistor and successive sample voltages.

2. An analog-to-digital circuit as in claim 1 further comprising:
   a current source to bias the transistor and produce the sample voltage on the capacitor.

3. An analog-to-digital circuit as in claim 1 further comprising:
   a control circuit that selectively couples the input voltage to a base of the transistor, an emitter of the transistor being electrically connected to the capacitor.

4. An analog-to-digital circuit as in claim 1 further comprising:
   a current source to bias the transistor when the transistor is selectively activated to charge the capacitor with a sample voltage.

5. An analog-to-digital circuit as in claim 4, wherein the input voltage is coupled to a base of the transistor and an emitter of the transistor is coupled to the capacitor to produce the sample voltage.

6. An analog-to-digital circuit as in claim 1, wherein the transistor is at least part of an open loop sample and hold circuit.

7. An analog-to-digital circuit as in claim 1, wherein the digital correction circuit corrects for at least one non-linearity in the transistor by estimating an approximate current drawn by the capacitor during charging as a result of a changing input voltage.

8. An analog-to-digital circuit as in claim 1, wherein the digital correction circuit estimates an actual value of the input voltage at a particular time using conversions of the sample voltage on the capacitor at two or more skewed sample times.

9. An analog-to-digital circuit as in claim 1, wherein a first sample voltage is produced by a first open loop circuit driven by the input voltage and a second sample voltage is produced by a second open loop circuit driven by the input voltage.

10. An analog-to-digital circuit as in claim 9 further comprising:
    at least one delay element to offset sample clocks of the first and second open loop circuits to produce corresponding time delayed sample voltages.

11. A method of converting an analog input voltage to a digital output, the method comprising:
    charging a capacitor to a sample voltage via an open loop circuit driven by the input voltage;
    converting the sample voltage on the capacitor to a digital output signal; and
    compensating for differences in voltage between the sample voltage on the capacitor and the input voltage based on properties of the open loop circuit and successive sample voltages.

12. A method as in claim 11, wherein the open loop circuit includes at least one transistor to charge the capacitor.

13. A method as in claim 11 further comprising:
    coupling the input voltage to a transistor circuit, an output of which produces the sample voltage on the capacitor.

14. A method as in claim 13 further comprising:
    biasing the transistor circuit with current when the transistor circuit is selectively activated to charge the capacitor.

15. A method as in claim 11, wherein the open loop circuit is an emitter follower circuit.

16. A method as in claim 11, wherein the step of compensating for differences in voltage further includes:
    correcting for at least one non-linearity in the open loop circuit by estimating an approximate current drawn or discharged by the capacitor during charging as a result of a varying input voltage.

17. A method as in claim 11 further comprising:
    coupling the input voltage to the base of a transistor;
    biasing the transistor with a bias current;
    electrically coupling an emitter of the transistor to the capacitor to produce the sample voltage, a difference between the sample voltage on the capacitor and input voltage being VBE; and
    estimating an actual value of the input voltage at a particular point in time based upon the bias current, sample voltages at different times and by estimating a portion of VBE caused by current drawn by the capacitor during charging.

18. A method as in claim 11, wherein the step of compensating includes:
estimating an actual value of the input voltage by converting the sample voltage on the capacitor at two or more skewed sample times.

19. A method as in claim 11, wherein a first sample voltage is produced by a first open loop circuit driven by the input voltage and a second sample voltage is produced by a second open loop circuit driven by the input voltage.

20. A method as in claim 19 further comprising:
offsetting sample clocks of the first and second open loop circuits to produce corresponding time delayed sample voltages.

21. A method as in claim 20 further comprising:
multiplexing outputs of the first and second open loop circuits, each having a corresponding capacitor and sample voltage, to convert the input voltage to a digital output signal using a single analog-to-digital converter.

22. A system for converting an analog input voltage to a digital output, the system comprising:
a first open loop sample and hold circuit including a capacitor charged to a first sample voltage from a first transistor controlled by the input voltage;
a second open loop sample and hold circuit including a capacitor charged to a second sample voltage from a second transistor controlled by the input voltage; and
a digital correction circuit that compensates for non-linearities of at least one of the open loop circuits based on properties of the transistors and sample voltages on the capacitors at different times.

23. A system as in claim 22 further comprising:
current sources to bias the transistors with current when the transistors are selectively activated to charge a corresponding capacitor.

24. A system as in claim 22, wherein the digital correction circuit estimates an actual value of the input voltage at a particular time using conversions of the first and second sample voltages at skewed sample times.

25. A system as in claim 24, wherein sampling clocks of the first and second open loop circuits are offset to produce corresponding time delayed sample voltages.

26. A system as in claim 22, further comprising:
a multiplexer circuit that selects which sample voltage of the open loop circuits to couple to an analog-to-digital converter circuit.

27. A system as in claim 26, wherein the analog-to-digital converter circuit operates at double speed than when each open loop sample and hold are coupled to separate analog-to-digital circuits.

28. A system as in claim 21, wherein each of the open loop sample and hold circuits is coupled to a corresponding analog-to-digital converter circuit.

29. A system to convert an analog input voltage to a digital output, the system comprising:
means for charging a capacitor to a sample voltage via an open loop circuit driven by the input voltage;
means for converting the sample voltage on the capacitor to a digital output signal; and
means for compensating for differences in voltage between the sample voltage on the capacitor and the input voltage based on properties of the open loop circuit and successive sample voltages on the capacitor.

* * * * *